United States Patent
Hung et al.

[19]

[11] Patent Number: 5,998,826
[45] Date of Patent: *Dec. 7, 1999

[54] TRIPLE WELL FLOATING GATE MEMORY AND OPERATING METHOD WITH ISOLATED CHANNEL PROGRAM, PREPROGRAM AND ERASE PROCESSES

[75] Inventors: Chun-Hsiung Hung, Hsinchu; Tzeng-Huei Shiau, Hsin-Pu, both of Taiwan; Ray-Lin Wan, Fremont, Calif.; Fu-Chia Shone, Hsinchu, Taiwan

[73] Assignee: Macronix International Co., Ltd., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/817,656

[22] PCT Filed: Sep. 5, 1996

[86] PCT No.: PCT/US96/14349

§ 371 Date: Apr. 4, 1997

§ 102(e) Date: Apr. 4, 1997

[87] PCT Pub. No.: WO98/10471

PCT Pub. Date: Mar. 12, 1998

[51] Int. Cl.$^6$ .......................... H01L 29/788; H01L 27/76
[52] U.S. Cl. ............................................ 257/315; 257/314
[58] Field of Search ...................................... 257/315, 314

[56] References Cited

U.S. PATENT DOCUMENTS

| | | |
|---|---|---|
| 5,216,269 | 6/1993 | Middelhoek et al. . |
| 5,225,362 | 7/1993 | Bergemont . |
| 5,300,803 | 4/1994 | Liu . |
| 5,341,342 | 8/1994 | Brahmbhatt . |
| 5,553,020 | 9/1996 | Keeney et al. ..................... 365/185.19 |

OTHER PUBLICATIONS

Muller, Richard S. et al., "Device Electronics for Integrated Circuits", John Wiley & Sons; New York, 1986, pp. 452–454.

Onada, H. et al., "A Novel Cell Structure Suitable for a 3 Volt Operation, Sector Erase Flash Memory", 0-7803-0817-Apr. 1992, IEEE, 1992, pp. 599–602.

(List continued on next page.)

*Primary Examiner*—Stephen D. Meier
*Attorney, Agent, or Firm*—Haynes & Beffel LLP

[57] ABSTRACT

A new flash memory cell structure and operational bias is based on the use of a triple well flash memory cell which allows Fowler Nordheim (F-N) tunneling with lower absolute value bias potentials. Thus, the floating gate memory cell is made in a semiconductor substrate having a first conductivity type, such as p-type. A first well within the substrate by having a second conductivity type different than the first conductivity type is included. A second well within the first well is also included having the first conductivity type. A drain and a source are formed in the second well having the second conductivity type, and spaced away from one another to define a channel area between the drain and the source. A floating gate and control gate structure is included over the channel area. The floating gate memory cell is coupled with circuits that induce F-N tunneling of electrons out of the floating gate into the channel area of the substrate for erasing by applying a positive voltage to the second well, such as a voltage higher than the supply voltage, applying a positive voltage to the first well, which is substantially equal to the positive voltage of the second well, applying a negative voltage to the control gate of the cell, while the substrate is grounded. A block wide preprogram operation involves F-N tunneling of electrons into the floating gate from the channel area, using a negative voltage in the second well. Also, circuits are coupled with the cell to induce hot electron injection current of electrons into the floating gate for programming or byte by byte preprogramming.

32 Claims, 4 Drawing Sheets

OTHER PUBLICATIONS

Kume, H. et al., "A 1.28$\mu$m$^2$ Contactless Memory Cell Technology for a 3V–Only 64Mbit EEPROM", IEDM, 1992, pp. 991–993.

Tamura, Y. et al., "Most Promising Metal–to–Metal Antifuse based 10nm–thick p–SiNx film for High Density and High Speed FPGA Application", 0–7803–2111–1, IEEE, 1994, pp. 285–288.

Bergemont, A. et al., "NOR Virtual Ground (NVG)–A New Scaling Concept for Very High Density FLASH EEPROM and its Implementation in a 0.5 $\mu$m Process", 0–7803–1450, IEEE, 1993, pp. 15–18.

5,998,826

TRIPLE WELL FLOATING GATE MEMORY AND OPERATING METHOD WITH ISOLATED CHANNEL PROGRAM, PREPROGRAM AND ERASE PROCESSES

BACKGROUND OF THE INVENTION

1. Field of the Invention

The present invention relates to nonvolatile memory devices, and more particularly to an improved nonvolatile memory based on floating gate transistors.

2. Description of Related Art

Flash memory is a class of nonvolatile memory integrated circuits, based on floating gate transistors. The memory state of a floating gate cell is determined by the concentration of charge trapped in the floating gate. The operation of flash memory is largely dependent on the techniques used for injected or removing charge from the floating gate.

There are at least two basic techniques utilized for moving charge into and out of floating gate memory cells. A first technique is referred to as hot electron injection. Hot electron injection is induced by applying a positive voltage between the drain and source of the memory cell, and a positive voltage to the control gate. This induces a current in the cell, and hot electrons in the current are injected through the tunnel oxide of the floating gate cell into the floating gate. Hot electron injection is a relatively high current operation, and is therefore usually limited to use for programming a few cells at a time in the device.

A second major technique for moving charge into and out of the floating gate of flash memory cells is referred to as Fowler-Nordheim tunneling (F-N tunneling). F-N tunneling is induced by establishing a large electric field between the control gate and one of the drain, source, and channel or between the control gate and a combination of these terminals. The electric field establishes a F-N tunneling current through the tunnel oxide and can be used for both injecting electrons into the floating gate, and driving electrons out of the floating gate. The F-N tunneling process is relatively low-current, because it does not involve a current flowing between the source and drain of the cells. Thus, it is commonly used in parallel across a number of cells at a time on a device.

Operation of flash memory involves programming the array, which requires a cell-by-cell control of the amount of charge stored in the floating gate, and erasing by which an entire array or a sector of the array is cleared to a predetermined charge state in the floating gate. In one kind of flash memory, F-N tunneling is used both for programming and for erasing cells in the array. In a second kind of flash memory, hot electron injection is used for programming and F-N tunneling is used for erasing.

The F-N tunneling erase used in prior approaches, has been a limiting factor on the ability to use low supply voltages (VDD less than 5 volts) with the integrated circuit chips. For example, one common approach is based on a memory cell formed in a p-type semiconductor substrate having n-type source and drain regions. A source-side F-N tunneling erase operation is biased by applying an erasing potential of about twelve volts to the source, grounding the substrate, and setting the wordline connected to the control gate of the cells to be erased at zero volts. Thus, an erase operation is achieved by F-N tunneling between the source and the floating gate. However, a large voltage difference (12 volts) is established between the source and the substrate. This voltage difference induces unwanted substrate current and hot hole current. To suppress the unwanted current a so-called double diffusion source process is used. The double diffusion creates a gradual or two stage change in concentration of n-type doping between the source and the substrate. This reduces the stress at the interface between the source and the substrate, and suppresses the unwanted current. However, the double diffusion source limits the ability to shrink the size of the cell.

An alternative approach to source side erase is achieved using a cell formed on a p-type substrate with n-type source and drain regions. To induce erase, the source potential is set at the supply voltage VDD, such as at five volts. The substrate is grounded, and the wordline is set to a negative high voltage such as negative seven volts. This approach has advantages over the approach described above where the wordline is grounded. However, the unwanted substrate current and hot hole current are not eliminated completely. At low supply voltages, such as 2.2 volts, an extremely high negative potential is required for the wordline to establish the large voltage difference between the source and wordline that is necessary for F-N tunneling. Alternative approaches that apply higher voltage to the source do so at the cost of the source current loading at levels difficult to supply by charge pump type voltage sources typically used on flash memory chips.

In a third common approach, the flash cell is formed in an n-type substrate, in which a p-well is formed. N-type source and drain regions within the p-well are used for the cells. F-N tunneling erase is biased by setting the p-well to the supply potential and the wordline of selected cells to a negative high voltage, while the wordlines of cells that are not selected are set to the supply voltage. This induces F-N tunneling between the floating gate and the channel (in the p-well) of the devices. The substrate current and hot hole generation problems are eliminated. See, Bergemont et al. "NOR Virtual Ground ("NVG")—A New Scaling Concept for Very High Density Flash EEPROM and its Implementation in a 0.5 um Process" IEDM, 93-15 to 93-18 (1993). However, this approach is not suitable for low supply voltages because of the very highly negative wordline voltage required for the electric field between the p-type well and the wordline that is necessary for the F-N tunneling, because the voltage applied to the p-type well is limited by the substrate potential. As the p-type well is biased to a voltage higher than the n-type substrate, a current flows from the well to the substrate, which is normally connected directly to the power supply for the chip. Also, the peripheral circuitry may include p-type MOS transistors, in which a higher substrate voltage results in a higher body effect, and impacts the performance of the peripheral circuitry. Thus, at a low supply potential, the channel potential available for inducing F-N tunneling is limited to about the level of the low supply potential. Therefore, the control gate must be driven to a more highly negative voltage for lower supply voltages.

Accordingly, it is desirable to provide a flash cell design, which operates at very low supply voltages, with limited unwanted current during the F-N tunneling operations, and with other improved features.

SUMMARY OF THE INVENTION

The present invention provides a new flash memory cell structure and operational bias approach based on the use of a triple well floating gate memory cell, suitable for use with a single low voltage power supply. Thus, the invention can be characterized as a floating gate memory cell in a semiconductor substrate having a first conductivity type, such as p-type. A first well within the substrate having a second conductivity type (such as n-type) different than the first conductivity type is included. A second well within the first well is also included, having the first conductivity type (p-type). The first well isolates the second well from the substrate. The second well is used for channel areas. A drain and a source are included in the second well having the second conductivity type (n-type), and spaced away from one another to define a channel area between the drain and the source within the second well. A floating gate structure over the channel area, includes a floating gate and a tunnel insulator between the floating gate and the substrate. A control gate structure over the floating gate, includes a control gate and an insulator between the floating gate and the control gate.

The triple well floating gate memory cell is coupled with circuits that induce F-N tunneling of electrons out of the floating gate into the channel area of the second well by applying a positive voltage to the second well, such as a voltage higher than the supply voltage, applying a positive voltage to the first well so that the junction between them is non-conducting, which is preferably about equal to the positive voltage of the second well, and applying a negative voltage to the control gate of the cell, while the substrate is grounded, or otherwise biased so that the junction between the first well and the substrate is non-conducting. Also, circuits are coupled with the cell to induce hot electron injection current of electrons into the floating gate by applying a positive voltage to the drain, such as a voltage higher than the supply potential, a positive voltage to the control gate, again which might be higher than the supply potential, grounding the source, grounding the second well, and applying a positive voltage to the first well, such as the supply voltage. The isolation provided by the first well allows biasing the channels of cells at a level higher than the supply voltage. The F-N tunneling erase operation is achievable according to the present invention using voltages which are not extremely high in absolute value, and may be implemented using a low supply voltage level, less than five volts and as low as about 2.2 volts, or lower. Also, these processes do not induce substrate current during erase, do not induce hot hole current during erase, and do not require double diffusion source structures.

Alternatively, the present invention can be characterized as an operating method for a floating gate memory cell having the triple well structure discussed above. The method comprises inducing tunneling current between the floating gate and the channel well of the triple well structure by applying a first potential to the control gate, a second potential to the channel well, a third potential to the isolation well and a fourth potential to the substrate. The first and second potentials establish an electric field between the control gate and the channel well sufficient to induce tunneling current. The third potential is set near or higher than the second potential so that current between the channel well and the isolation well is blocked. The fourth potential is set near or less than the third potential so that current between the isolation well and the substrate is blocked. In one aspect of the invention, the substrate is coupled to an external reference supply that applies a ground potential and a positive supply potential. In this aspect, the first potential that is applied to the control gate is negative, and the second potential that is applied to the channel well is a positive level and is higher than the supply potential. The third potential that is applied to the isolation well is near the second potential, and the fourth potential is at the ground potential.

This feature of the invention works particularly well when the supply potential is less than 5 volts, such as about 3 volts or lower. The potential applied to the channel well can be increased to above the supply potential by charge pump circuitry or the like. This way, the negative potential applied to the control gate need not be extremely negative, to the extent that more complex charge pump circuitry is required to induce the negative voltage, nor to the extent that unreasonable amount of stress is placed on the circuitry in the device. This bias technique is used for erasing the array. To bias the array for a pre-programming sequence, the voltage between the control gate and the channel well is reversed, such that the channel well is coupled to a negative potential and the control gate is connected to a positive potential. The isolation well is biased to isolate the channel well from the substrate.

The invention can also be characterized as a floating gate memory device on a semiconductor substrate. According to this aspect, the semiconductor substrate includes a region having a first conductivity type, which is one of n-type and p-type. A first well (also called isolation well) within the region of the substrate has a second conductivity type which is different from the first conductivity type. A second well (also called a channel well) within the first well has the first conductivity type. The device includes an array of floating gate memory cells which have respective drains, sources, channel areas between the drains and sources, with floating gates and control gates over the channel areas. The sources and drains of cells in the array within the second well have the second conductivity type. Thus, when the substrate is p-type, the first well is n-type, the second well is p-type, and the source and drain regions of the floating gate memory cells are n-type. In the array, hot electron programming is used as described above, where wordlines of selected cells receive a positive high voltage which may be higher than the supply potential, the drains of selected cells receive a positive high voltage, again which may be higher than the supply potential, the source and the p-type channel well are both grounded. The deep n-type isolation well is coupled to the supply potential. For erase, F-N tunneling is induced by applying a positive high voltage to both the isolation and channel wells, with a negative voltage to the wordlines connected to selected cells, and a positive high voltage to the wordlines of cells that are not selected. This positive high voltage on the wordline of cells not selected may be equal to the high voltage in the p-type well, or may not be.

According to another approach, the floating gate memory device includes a plurality of arrays of floating gate memory cells, each array being formed within an individual channel well. Thus there a plurality of channel wells. More than one of the channel wells are formed within a single isolation well in the substrate. In this way, each of the arrays may be individually selected for block erase. Thus, for the embodiment including a plurality of arrays in individual channel wells, the F-N tunneling is induced for erase by connecting the selected channel well to a positive high voltage, connecting the isolation well to a positive high voltage, and connecting the wordline of selected cells to a negative high voltage. The channel well and wordlines in arrays that are not selected are coupled to ground. This approach induces a smaller stress on peripheral devices compared to an architectural using a single channel well at the cost of a die size increase required to implement the separate channel wells.

The floating gate device according to the present invention also allows for an improved pre-programming sequence prior to erase. Prior approaches involve a pre-programming sequence in which a few bytes at a time are pre-programmed. This byte by byte approach is time consuming for a large array. According to the present invention, a sector-wide F-N tunneling technique may be utilized for pre-programming. For the embodiment in which a single channel well is formed within a single isolation well, the channel well is coupled to a negative high voltage (e.g. negative four to negative eight volts), the wordlines of selected cells are connected to a positive high voltage, and the wordlines of unselected arrays are connected to negative high voltage, and the isolation well is connected to the supply potential. For the embodiment including plurality of channel wells within a single isolation well, the channel wells are coupled to a negative high voltage, the wordline is connected to a positive high voltage (e.g. positive ten to positive four volts) while the isolation well is connected to the supply potential. Thus, F-N tunneling is used to execute a pre-program operation in parallel for a large number of cells, greatly simplifying the erasing process and increasing the erasing speed of the device.

Accordingly, the present invention provides a new flash memory cell design and operational bias approach which achieves a number of advantages over the prior art. In particular, there is no substrate current induced during erase. There is no hot hole current generated during erase. No double diffusion source region is required. It is not necessary to create extremely positive or negative high voltages on the device. A small block size is achievable. Furthermore, a very fast pre-program operation can be used.

Other aspects and advantages of the present invention can be seen upon review of the figures, the detailed description and the claims which follow.

DETAILED DESCRIPTION

Figure 1:
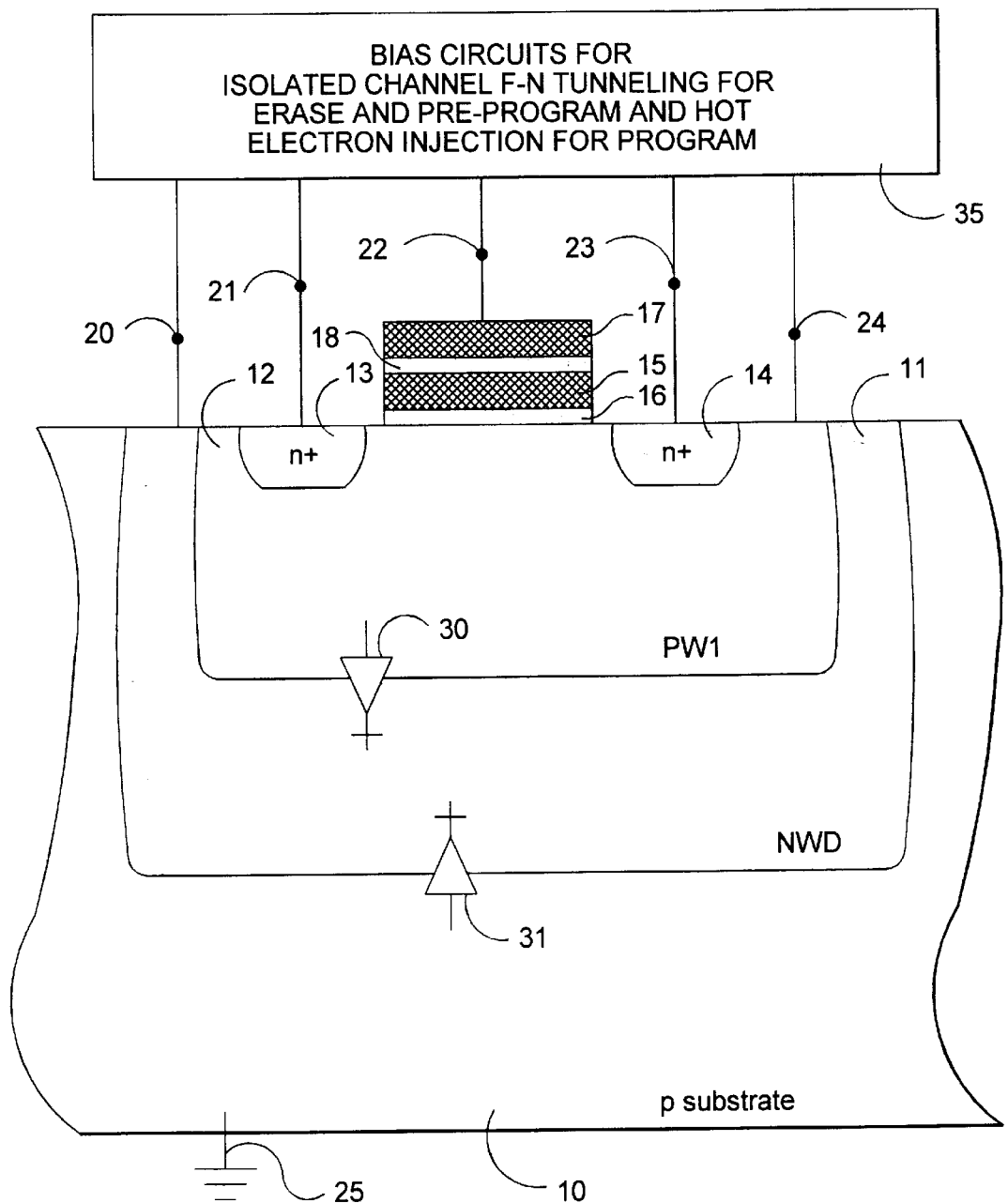
FIG. 1 is a cross section of a triple well flash memory cell according to the present invention.

A detailed description of preferred embodiments of the present invention is provided with respect to the figures, in which FIG. 1 illustrates the basic structure of the triple well floating gate memory cell according to the present invention. As shown in FIG. 1, a semiconductor substrate 10 has a first conductivity type. Preferably, the substrate 10 is silicon with a p-type doping. A deep n-type well NWD 11 is formed in the substrate 10. Inside the deep n-type well 11, a p-type well PWI 12 is included. An n-type source 13 and an n-type drain 14 are included inside the p-type well 12. A floating gate structure, including a floating gate 15 and a tunnel insulator 16, is formed over a channel area between the source 13 and drain 14. A control gate structure, including a control gate 17 and insulator 18, is formed over the floating gate 15.

The deep n-type well NWD 11 is implemented in one embodiment as a early step in the integrated circuit manufacturing process, in which the n-type well is patterned, and a $6\times10^{12}/cm^2$ phosphorous implant at about 120 kev is executed, followed by an anneal at about 1050° C. for about 12 hours. The p-type well PWI 12 is implemented in this embodiment by patterning the p-type well, and executing a $7\times10^{12}/cm^2$ boron implant at about 100 kev, followed by an anneal at about 1050° C. for about 3 hours, 10 minutes. This processing results in a n-type well in selected areas with a depth of about 6 microns, and a p-type well within selected areas of the n-type well with a depth of about 3 microns. The parameters of the process for forming the n-type and p-type wells will vary from embodiment to embodiment, to suit particular design needs.

The deep n-type well 11 acts as an isolation well for the device. The p-type well 12 provides a channel region for the cell. The n-type source and drain structures are formed within the p-type well 12, establishing a channel in the p-type well isolated from the substrate 10 by the isolation well 11. In FIG. 1, bias points 20 through 24 are illustrated for the structure. The bias point 20 is coupled to the deep n-type well 11 which is used for isolation. The contact point 21 is coupled to the source terminal 13. The contact 22 is coupled to the control gate of the cell. The contact 23 is coupled to the drain region 14. The contact 24 is coupled to the channel well 12. These terminals are biased in order to achieve programming and erasing according to the present invention.

Also shown in FIG. 1 are diode symbols 30 and 31, representing respectively the P-N junction between the channel well PWI 12 and the isolation well NWD 11, and the P-N junction between the substrate 10 and the isolation well. As long as the substrate 10 is biased at a level near or less than the isolation well 11, the P-N junction represented by diode symbol 31 is non-conducting. Also, as long as the channel well 12 is biased near or below the isolation well, the P-N junction represented by diode symbol 30 is non-conducting.

Bias circuits 35 apply potentials to the terminals 20 through 24 for hot electron injection and isolated channel F-N tunneling as described below.

The programming bias for p-type substrate 10 coupled to ground 25, is shown in Table 1 as follows:

TABLE 1

| PROGRAM | |
| --- | --- |
| Drain | Positive High Voltage |
| Source | Ground |
| p-type Channel Well | Ground |
| Wordline | Positive High Voltage |
| n-type Isolation Well | VDD |

Thus, a traditional hot electron programming technique is utilized for programming the triple well cell. (The p-type substrate is grounded.)

F-N tunneling is used for erasing. When a single channel well is used for the entire array (see FIG. 3), the bias to induce F-N tunneling, is illustrated in Table 2 as follows:

TABLE 2

| ERASE | |
| --- | --- |
| Channel Well | Positive High Voltage (e.g. about +12 volts) |
| Isolation Well | Positive High Voltage (e.g. about +12 volts) |
| Selected Wordline | Negative High Voltage (e.g. about −8 volts) |
| Deselected Wordline | Near Ground or Positive Voltage (e.g. about 0 volts) |

The example voltages set forth in the table are representative voltages, and will vary from embodiment to embodiment depending on such factors as gate coupling ratio of the memory cell, speed of operation requirements, and supply current available. The high positive voltages and negative voltages are typically generated by charge pumps on the integrated circuit, so that negative levels and levels higher than the VDD supply voltage which is applied to the chip by an external source, can be achieved. The VDD supply voltage therefore is not constrained to high values, and may be for example as low as two volts or lower. Further, a single low VDD supply is used in a preferred embodiment, with no need for a high programming potential VPP to be supplied by external, high current power supplies.

In a preferred embodiment of this process for channel erase, no voltage is applied to the source and drain, that is the source and drain are left floating, and because the junctions between the channel well and both of the source and drain are forward biased, the source and drain are driven by the voltage applied to the channel to a level about one diode drop below the channel voltage level. In alternative systems, bias voltages are applied to one or both of the source and drain, such as the same bias voltage as is applied to the channel well.

Where the device includes a set of channel wells within an isolation well (see FIG. 2), the bias points (except the source and drain to which no voltage is applied as mentioned above for preferred embodiments) for F-N tunneling erasing selected blocks are set out in Table 3 as follows:

TABLE 3

ERASE

| | |
|---|---|
| Selected Channel Well | Positive High Voltage (e.g. +12 volts) |
| Isolation Well | Positive High Voltage (e.g. +12 volts) |
| Selected Wordline | Negative High Voltage (e.g. −8 volts) |
| Deselected Channel Well | Near Ground or Positive Voltage (e.g. 0 volts) |
| Deselected Wordline | Near Ground or Positive Voltage (e.g. 0 volts) |

For the pre-programming operation based on F-N tunneling, where there are a plurality of channel wells within an isolation well (FIG. 2), the array is biased as set forth in Table 4 as follows:

TABLE 4

PRE-PROGRAM

| | |
|---|---|
| Selected Channel Well | Negative High Voltage |
| Selected Wordline | Positive High Voltage |
| Isolation Well | VDD |
| Deselected Channel Well | 0 Volts |
| Deselected Wordline | 0 Volts |

Where the architecture of the array includes a single channel well for a plurality of blocks of cells (FIG. 3), the pre-programming operation is biased as set forth in Table 5 as follows:

TABLE 5

PRE-PROGRAM

| | |
|---|---|
| Channel Well | Negative High Voltage |
| Selected Wordline | Positive High Voltage |
| Deselected Wordline | Negative High Voltage |
| Isolation Well | VDD |

The supply potential VDD ranges in the preferred system from about 2 volts (or less) to about 5 volts. The high positive potential applied to the channel well during the F-N erasing ranges from a level just above the supply potential, to about 14 volts. The high negative potential applied to the wordlines during channel erasing ranges from about minus 4 volts to about minus 8 volts. Also, the high voltage applied to unselected wordlines in the architecture of FIG. 3 during the F-N tunneling erase is greater than the supply potential, but not necessarily equal to the high voltage used for the channel well.

Figure 3:
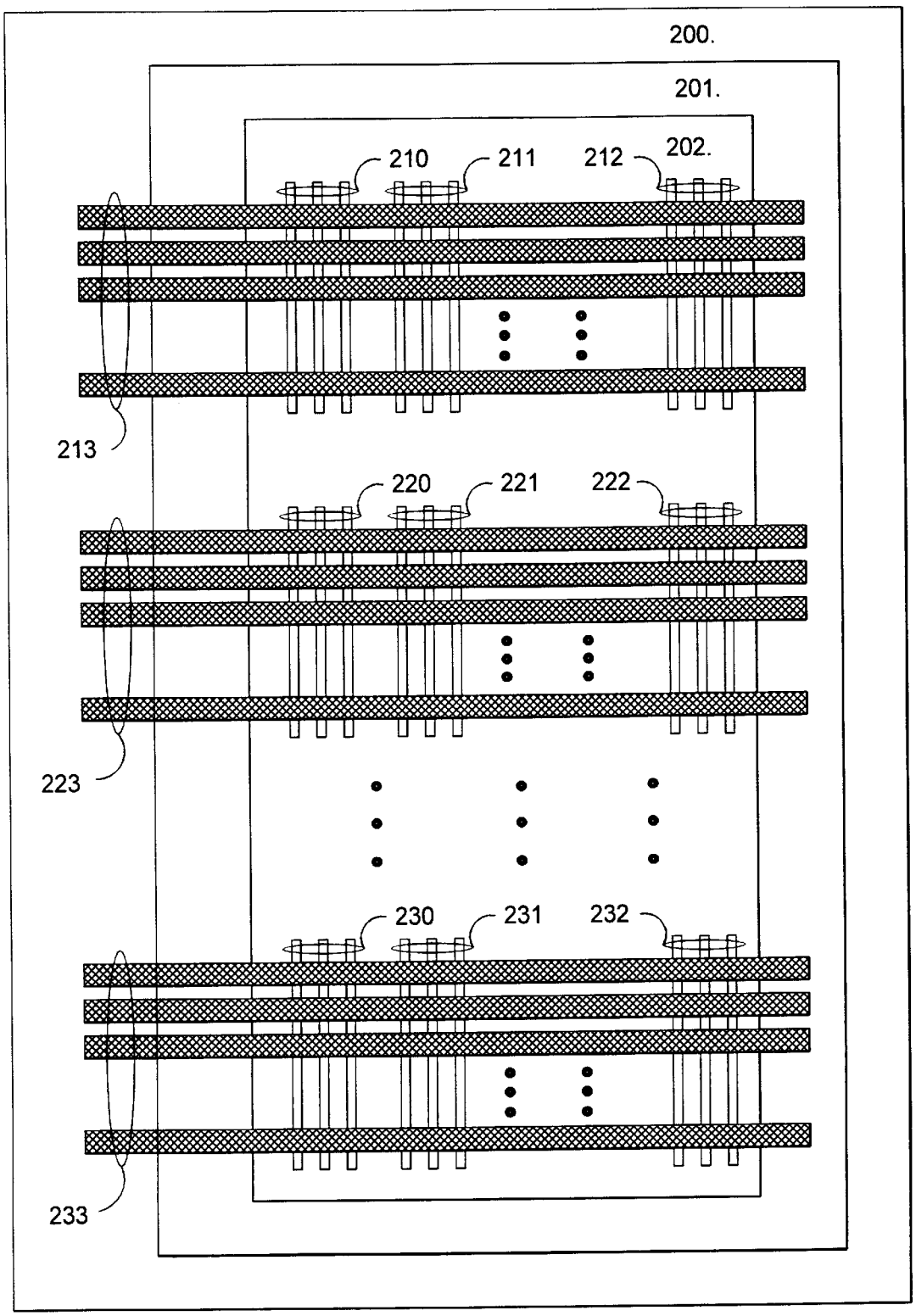
FIG. 3 is a simplified layout diagram for a flash memory device with a single channel well.

The negative high voltage used during the fast pre-programming operation ranges from about minus 4 volts to about minus 8 volts while the wordline potential ranges from above the supply potential VDD to about 10 volts. The negative high voltage used on the wordlines of deselected cells in the pre-programming operation according to the architecture FIG. 3 is in the neighborhood of the voltage applied to the channel well, but not necessarily equal to it.

Figure 2:
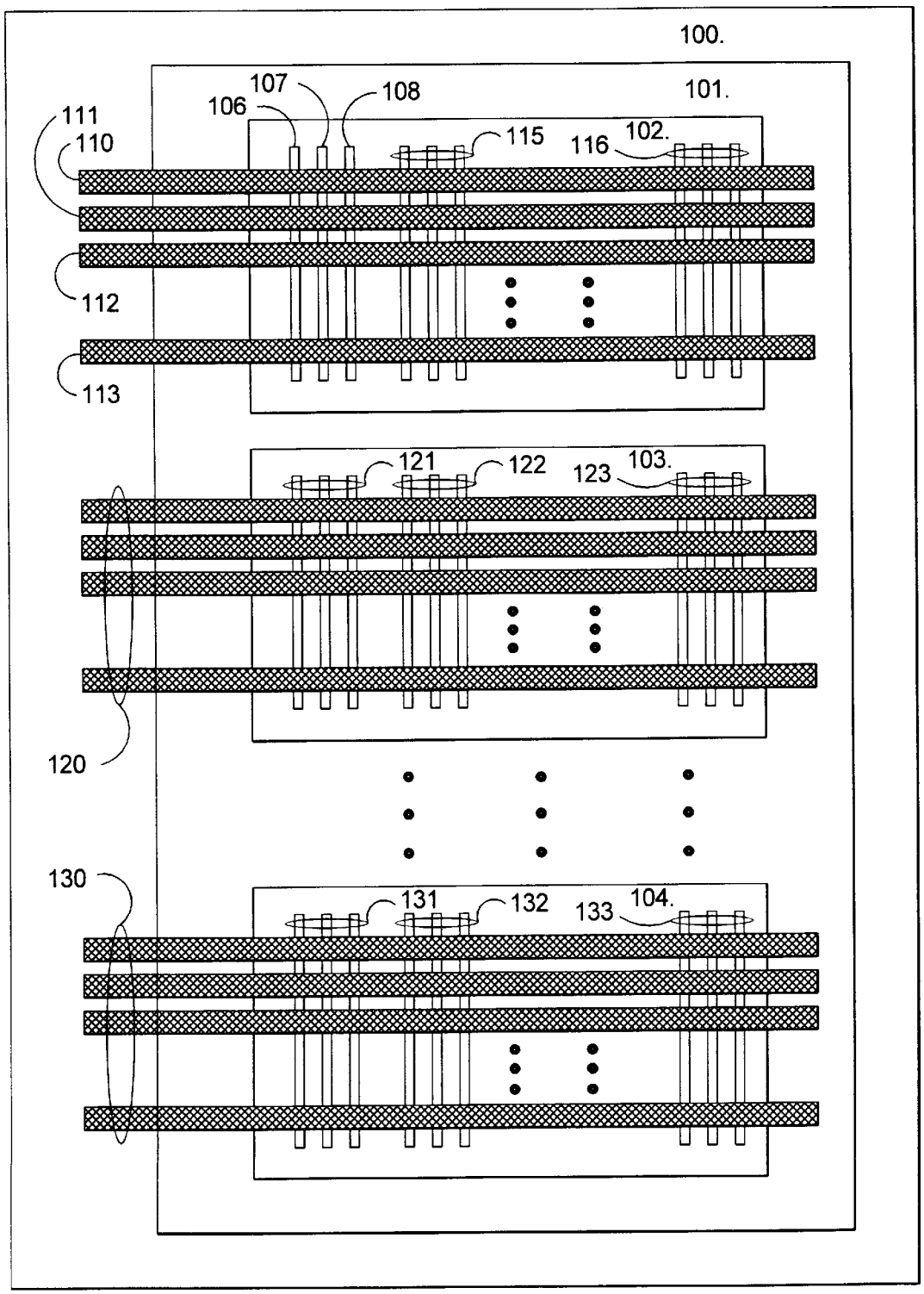
FIG. 2 is a simplified layout for a flash memory device including a plurality of channel wells and memory cell arrays according to the present invention.

There are two basic architectures (FIG. 2 and FIG. 3) for laying out the isolation well and channel well according to the present invention. FIG. 2 illustrates an embodiment in which there are a plurality of channel wells along with a corresponding plurality of separate arrays of floating gate memory cells. In FIG. 2, the semiconductor substrate is represented by the outer box 100. The isolation well is shaded box 101. The channel wells in the figure include channel well 102, channel well 103 and channel well 104. As represented in the figure, there may be a number of channel wells with corresponding arrays of floating gate memory cells in each one. The arrays of floating gate memory cells in the device of FIG. 2 are illustrated in a simplified format, with the drain and source diffusion regions and wordlines shown. The global bit lines, block select circuitry, and other circuits necessary for completing the structure are not illustrated in the figure, are well understood by persons of skill in the art. For instance, this architecture can be implemented as described in U.S. Pat. No. 5,399,891 or U.S. Pat. No. 5,526,307, both of which are incorporated by reference as if fully set forth herein.

Thus, in the channel well 102, a plurality of drain-source-drain structures are shown, in which a drain diffusion 106, a source diffusion 107 and a drain diffusion 108 define two columns of cells, and in which wordlines 110, 111, 112, 113 intersect the drain diffusion 106, source diffusion 107, and drain diffusion 108 over memory cells. Within the channel well 102, additional drain-source-drain structures 115, 116 are included to provide an array within the channel well 102. As illustrated in the figure by the shading, the isolation well 101, the drain diffusion regions 106 and 108, and the source diffusion regions 107, all have the same conductivity type, preferably n-type. The substrate 100 and the channel region 102 are both of the same conductivity type, preferably p-type.

The arrays in other channel wells 103 and 104 are configured with a similar structure. Thus, a plurality of wordlines 120 is included for channel well 103. Drain-source-drain structures 121, 122, 123 within channel well 103 intersected by the wordlines 120 form the array of flash memory cells.

In a similar fashion the channel well 104 includes an array of flash memory cells composed of the wordlines 130, and the drain-source-drain structures 131, 132 and 133.

This architecture is suitable for systems in which it is desirable to erase arrays having a block size equal to that of the channel well, such as the channel well 103. The channel wells can be individually biased to avoid disturbance of unselected cells, and to reduce stress on peripheral devices outside of the array on the substrate.

For a smaller array size, and a small overall integrated circuit size, the architecture of FIG. 3 is suitable. According to the architecture FIG. 3, substrate 200 has a first conductivity type, such as p-type. An isolation well 201 has a second conductivity type, preferably n-type. A channel well 202 is formed within the isolation well 201, having a conductivity type which is the same as that of the substrate. A plurality of blocks of floating gate memory cells is formed within the channel well 202 to produce a large array. Thus, a first block includes a set of drain-source-drain structures 210, 211, 212 and a set of wordlines 213. The individual flash memory cells reside between the source and drain diffusions and underneath the wordlines in the array. A second block of cells is based on drain-source-drain structures 220, 221 and 222 with wordlines 223. A third set of cells is based on drain-source-drain structures 230, 231 and 232, with wordlines 233.

According to the architecture in FIG. 3, unselected wordlines during the erase process are driven into a positive high voltage near the level of the channel well to prevent disturbance of the cells, while erasing other blocks.

Figure 4:
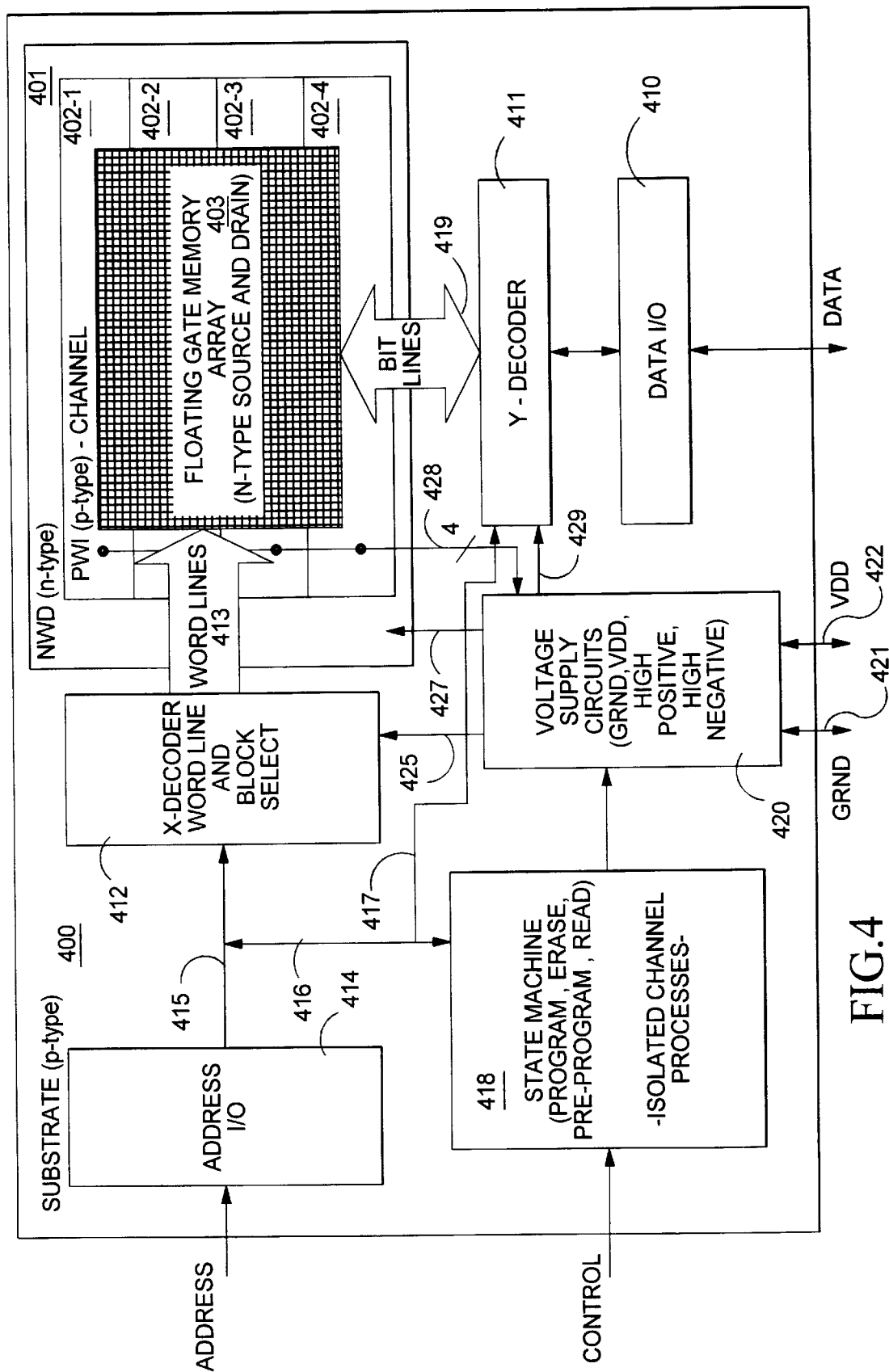
FIG. 4 is a simplified block diagram of a flash memory integrated circuit according the present invention.

FIG. 4 provides a simplified diagram of an integrated circuit memory device including the floating gate memory array using the triple well architecture of the present invention. Thus, a semiconductor substrate 400 includes an isolation well 401 and a set of channel wells 402-1, 402-2, 402-3 and 402-4 for an array 403 of floating gate memory cells. In the preferred embodiment, the substrate 400 is p-type. The isolation well 401 is n-type. The channel wells 402-1 to 402-4 are p-type, and the source and drain regions of the cells in the floating gate memory array 403 are n-type.

The architecture of the array may be implemented according to that of FIG. 2 or that of FIG. 3, depending on a particular use for which the device is designed. In FIG. 4, the architecture of FIG. 2 is shown with channel wells 402-1, 402-2, 402-3 and 402-4.

Peripheral circuitry on the substrate 400 is coupled with the array 403. The peripheral circuitry includes data input/output logic 410 which is coupled to a Y decoder 411. The Y decoder 411 is coupled to the bit lines 419 of the array 403, providing access to the array for reading and programming. Also the peripheral circuitry includes an X decoder 412 which includes wordline and block select drivers for the array 403. The X decoder 412 is coupled to the wordlines 413 and other control lines for accessing rows and blocks of cells in the floating gate memory array 403. Address input/output (I/O) logic 414 is coupled to the X decoder 412, and to the Y decoder 411 across line 415, line 416 and line 417. Also, the address I/O logic 414 is coupled to a state machine 418 which executes the control programs for programming, erasing, pre-programming and reading cells in the array.

The substrate 400 also includes voltage supply circuits 420. The voltage supply circuits are coupled to an external ground on line 421 and to an external supply voltage VDD on line 422. The external supply voltage VDD may range from about 2 volts to about 5 volts in preferred systems. The voltage supply circuits 420 are used to supply ground, VDD, high positive, and high negative to the isolation well 401, the channel well 402, the source and drain regions in the array 403 and the wordlines 413 in order to achieve the bias conditions discussed above for the triple well architecture.

Thus, the voltage supply circuits 420 include voltage dividers, charge pumps, and other circuitry which is utilized to generate bias voltages to drive the program, erase, pre-program and read operations of the memory device. Thus, as illustrated in FIG. 4, the voltage supply circuits 420 are coupled to the X decoder 412 on line 425 for controlling the bias level on the control gates of cells in the array across the wordlines 413. Also the voltage supply circuits 420 are coupled to the Y decoder 411 on line 429 for controlling the bias on the source and drain terminals of the cells through the bit lines 419. In alternative systems, the source potential may be applied through special source bias lines independent of the bit lines.

The voltage supply circuits 420 are connected to the isolation well 401 on line 427. The voltage supply circuits 420 are connected to the plurality of channel wells 402-1 through 402-4 on supply lines 428, one for each channel well which are individually controllable. The state machine 418 controls the supply circuits to bias the selected channel wells, the isolation well and other terminals appropriately.

As illustrated in the figure, the p-type channel well is implemented in 4 units 402-1 through 402-4 according to the architecture of FIG. 2. An alternative system includes the architecture of FIG. 3 in which a single bias line is needed for the channel well.

Accordingly, the present invention provides a triple well flash memory device architecture which provides significant advantages over the prior art. During F-N tunneling erase, the isolation well 401 allows channel erase with a high positive potential. Thus, a less negative control gate potential can be utilized during the erasing. Because there is no high voltage difference between the source or drain and the channel well, there is no substrate current, and no hot hole current. No double diffusion source structure is necessary to reduce the junction potentials in the source during the erase process. The use of high voltage in the channel well allows the use of moderate levels of positive and negative high voltages. Further, a special fast pre-programming operation is available using F-N tunneling through the channel erase structure. Accordingly, a very flexible architecture is available with large or small blocks of cells.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A floating gate memory cell in a semiconductor substrate including a region having a first conductivity type, the first conductivity type being one of n-type and p-type, and wherein the substrate is coupled to an external reference supply applying a ground potential and a positive supply potential, comprising:

a first well within the region of the substrate having a second conductivity type, being one of n-type and p-type and different than the first conductivity type;

a second well within the first well, having the first conductivity type;

a drain within the second well, having the second conductivity type;

a source within the second well, having the second conductivity type, and spaced away from the drain to define a channel area between the drain and the source;

a floating gate structure disposed over the channel area and extending substantially from the source to the drain, including a floating gate and a tunnel insulator between the floating gate and the substrate;

a control gate structure over the floating gate, including a control gate and an insulator between the floating gate and the control gate; and circuits to induce tunneling of electrons out of the floating gate into the channel area of the substrate by applying a positive voltage higher than the supply potential to the second well, a positive voltage to the first well, and a negative voltage to the control gate, while the region of the substrate is grounded.

2. The floating gate memory cell of claim 1, wherein the first conductivity type is p-type.

3. The floating gate memory cell of claim 1, including circuits to induce tunneling of electrons out of the channel area into the floating gate of the substrate by applying a negative voltage to the second well, a positive voltage to the first well, and a positive voltage to the control gate, while the region of the substrate is grounded.

4. The floating gate memory cell of claim 1, including circuits to induce hot electron injection current of electrons into the floating gate by applying a positive voltage to the drain, a positive voltage to the control gate, ground to the source, ground to the second well, and a positive voltage to the first well, while the region of the substrate is grounded.

5. A floating gate memory array on a semiconductor substrate, including a region having a first conductivity type, the first conductivity type being one of n-type and p-type, and wherein the substrate is coupled to an external reference supply applying a ground potential and a positive supply potential comprising:

a first well within the region of the substrate having a second conductivity type, being one of n-type and p-type and different than the first conductivity type;

a second well within the first well, having the first conductivity type;

an array of floating gate memory cells having respective drains, sources, channel areas between the respective sources and drains, floating gates, and control gates over the channel areas, the sources and drains being within the second well, and having the second conductivity type; and voltage supply circuits to induce F-N tunneling of electrons out of the floating gates into the channel areas of the substrate by applying a positive voltage higher than the supply potential to the second well, a positive voltage to the first well, and a negative voltage to the control gates of selected cells, while the region of the substrate is grounded.

6. The floating gate memory array of claim 5, wherein the voltage supply circuits include circuits to apply a positive voltage to control gates of cells not selected.

7. The floating gate memory array of claim 5, wherein the first conductivity type is p-type.

8. The floating gate memory array of claim 5, including circuits to induce F-N tunneling of electrons out of the channel area into the floating gate of the substrate by applying a negative voltage to the second well, a positive voltage to the first well, and a positive voltage to the control gates of selected cells, while the region of the substrate is grounded.

9. The floating gate memory array of claim 5, including circuits to induce hot electron injection current of electrons into the floating gate by applying a positive voltage to the drain of a selected cell, a positive voltage to the control gate the selected cell, ground to the source, ground to the second well, and a positive voltage to the first well, while the region of the substrate is grounded.

10. The floating gate memory array of claim 5, including circuits to induce F-N tunneling current of electrons into the floating gates of cells in the array by applying a positive voltage to the control gates of selected cells in the array, a negative voltage to the control gates of cells not selected, a negative voltage to the second well, and a positive voltage to the first well, while the region of the substrate is grounded.

11. The floating gate memory array of claim 5, wherein the floating gates of the array of floating gate memory cells are disposed over the respective channel areas and extend substantially between the respective sources and drains.

12. A floating gate memory array on a semiconductor substrate, including a region having a first conductivity type, the first conductivity type being one of n-type and p-type, and wherein the substrate is coupled to an external reference supply applying a ground potential and a positive supply potential comprising:

an isolation well within the region of the substrate having a second conductivity type, being one of n-type and p-type and different than the first conductivity type;

a plurality of channel wells within the isolation well, having the first conductivity type;

a plurality of arrays of floating gate memory cells within respective channel wells in the plurality of channel wells, the memory cells having respective drains, sources, channel areas between the respective sources and drains, floating gates, and control gates over the channel areas, the sources and drains being within the respective channel wells, and having the second conductivity type.

13. The floating gate memory array of claim 12, wherein the first conductivity type is p-type.

14. The floating gate memory array of claim 12, including circuits to induce F-N tunneling of electrons out of the floating gate into the channel areas of cells in a selected array by applying a positive voltage higher than the supply potential to the selected channel well, a positive voltage to the isolation well, and a negative voltage to the control gates of cells in the selected array, and ground to the channel wells and control gates of cells in arrays not selected while the region of the substrate is grounded.

15. The floating gate memory array of claim 12, including circuits to induce hot electron injection current of electrons into the floating gate by applying a positive voltage to the drain of a selected cell, a positive voltage to the control gate the selected cell, ground to the source of the selected cell, ground to the channel well of the array of the selected cell, and a positive voltage to the isolation well, while the region of the substrate is grounded.

16. The floating gate memory array of claim 12, including circuits to induce F-N tunneling current of electrons into the floating gates of cells in a selected array by applying a positive voltage to the control gates of cells in the selected array, a negative voltage to the channel well of the selected array, and a positive voltage to the isolation well, while the region of the substrate is grounded.

17. The floating gate memory array of claim 12, wherein the floating gates of the plurality of arrays of floating gate memory cells are disposed over the respective channel areas and extend substantially between the respective sources and drains.

18. A method for erasing a block of floating gate memory cells, the respective cells in the block including a drain, a source, a floating gate and a control gate, on a semiconductor substrate having a first conductivity type, the substrate including an isolation well having a second conductivity type different than the substrate, a channel well within the isolation well having the first conductivity type, and source and drain regions for the cells in the block having the second conductivity type within the channel well, the method comprising:

pre-programming cells in the block by inducing tunneling current between the floating gates and the channel well to pre-program cells in the block by applying respective pre-programming potentials to the control gates, to the channel well, to the isolation well and to the substrate, the pre-programming potentials applied to the control gates and the channel well set to establish an electric field between the control gates and the channel well sufficient to induce tunneling current of electrons into the floating gates, the pre-programming potential applied to the isolation well set so that current between the channel well and the isolation well is blocked, and the pre-programming potential applied to the substrate set so that current between the isolation well and substrate is blocked; and erasing the cells in the block by inducing tunneling current between the floating gates and the channel well to erase the pre-programmed cells in the block by applying respective erasing potentials to the control gates, to the channel well, to the isolation well and to the substrate, the erasing potentials applied to the control gates and the channel well set to establish an electric field between the control gates and the channel well sufficient to induce tunneling current of electrons out of the floating gates, the erasing potential applied to the isolation well set so that current between the channel well and the isolation well is blocked, and the erasing potential applied to the substrate set so that current between the isolation well and substrate is blocked.

19. The method of claim 18, wherein during the step of erasing, the erasing potential applied to the control gate is negative, and the erasing potential applied to the channel well is positive.

20. The method of claim 19, wherein the erasing potential applied to the isolation well is near the erasing potential applied to the channel well, and the fourth potential is less than the third potential.

21. The method of claim 19, wherein the substrate is coupled to an external reference supply applying a ground potential and a positive supply potential, and wherein erasing potential applied to the channel well is higher than the supply potential.

22. The method of claim 21, wherein the erasing potential applied to the isolation well is near the erasing potential applied to the channel well and the fourth potential is near the ground potential.

23. The method of claim 21, wherein the supply potential is less than five volts.

24. The method of claim 18 wherein during the step of pre-programming, the pre-programming potential applied to the channel well is negative, and the pre-programming potential applied to the control gate is positive.

25. The method of claim 24, wherein the pre-programming potential applied to the isolation well is positive, and the pre-programming potential applied to the substrate is less than the pre-programming potential applied to the isolation well.

26. The method of claim 18, wherein the substrate is coupled to an external reference supply applying a ground potential and a positive supply potential, and wherein during the step of pre-programming, the pre-programming potential applied to the channel well is negative, and the pre-programming potential applied to the control gate is positive, the pre-programming potential applied to the isolation well is near the supply potential, and the pre-programming potential applied to the substrate is near ground.

27. A method for flash erase of a floating gate memory cell, including a drain, a source, a floating gate and a control gate, on an integrated circuit having a substrate with a first conductivity type, the substrate including an isolation well having a second conductivity type different than the substrate, a channel well within the isolation well having the first conductivity type, and source and drain regions for the cell having the second conductivity type within the channel well, the integrated circuit further including only a supply pin and a ground pin for supplying power to the integrated circuit, the method comprising:

generating a channel well voltage higher than the supply potential on the integrated circuit of a same polarity as that of an external voltage present on the supply pin;

applying the channel well voltage to the channel well during flash erase;

generating a control gate voltage on the integrated circuit of an opposite polarity as that of the external voltage present on the supply pin; and applying the control gate voltage to the control gate during flash erase.

28. The method of claim 27, wherein the channel well voltage has a magnitude higher than the external voltage.

29. The method of claim 27, wherein the control gate voltage is negative.

30. The method of claim 27, including allowing the source and the drain to float during flash erase.

31. The method of claim 27, wherein the control gate voltage has a magnitude in a range from negative 4 to negative 10 volts, and the channel well voltage has a magnitude in a range from near the external voltage level to positive 14 volts.

32. The method of claim 31, wherein the external voltage is specified at 5 volts or less.

* * * * *